(12) United States Patent
Sun et al.

(10) Patent No.: US 9,533,332 B2
(45) Date of Patent: Jan. 3, 2017

(54) METHODS FOR IN-SITU CHAMBER CLEAN UTILIZED IN AN ETCHING PROCESSING CHAMBER

(75) Inventors: Noel Sun, Sunnyvale, CA (US); Meihua Shen, Fremont, CA (US); Nicolas Gani, Fremont, CA (US); Chung Nang Liu, Foster City, CA (US); Radhika C. Mani, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 668 days.

(21) Appl. No.: 13/614,365

(22) Filed: Sep. 13, 2012

(65) Prior Publication Data

US 2013/0087174 A1    Apr. 11, 2013

Related U.S. Application Data

(60) Provisional application No. 61/544,009, filed on Oct. 6, 2011.

(51) Int. Cl.
*B08B 5/00* (2006.01)
*B08B 7/00* (2006.01)
*B08B 9/08* (2006.01)
*C23C 16/44* (2006.01)
*H01J 37/32* (2006.01)

(52) U.S. Cl.
CPC ............ *B08B 5/00* (2013.01); *C23C 16/4405* (2013.01); *H01J 37/32449* (2013.01); *H01J 37/32862* (2013.01); *B08B 7/0035* (2013.01); *Y10S 438/905* (2013.01)

(58) Field of Classification Search
CPC ............ C23C 16/4401; C23C 16/4405; B08B 7/0035; H01J 37/32862; Y10S 438/905
USPC ................................ 134/1.1, 22 A; 438/905
See application file for complete search history.

(56) References Cited

U.S. PATENT DOCUMENTS

| | | |
|---|---|---|
| 5,071,714 A | 12/1991 | Rodbell et al. |
| 5,110,408 A | 5/1992 | Fujii et al. |
| 5,188,979 A | 2/1993 | Filipiak |
| 5,200,028 A | 4/1993 | Tatsumi |
| 5,337,207 A | 8/1994 | Jones et al. |
| 5,356,478 A * | 10/1994 | Chen .................... B08B 7/0035 134/1 |
| 5,356,833 A | 10/1994 | Maniar et al. |
| 5,391,244 A | 2/1995 | Kadomura |
| 5,674,782 A | 10/1997 | Lee et al. |
| 5,817,578 A * | 10/1998 | Ogawa .......................... 438/714 |
| 6,184,072 B1 | 2/2001 | Kaushik et al. |
| 6,204,141 B1 | 3/2001 | Lou |
| 6,270,568 B1 | 8/2001 | Droopad et al. |

(Continued)

*Primary Examiner* — Michael Kornakov
*Assistant Examiner* — Natasha Campbell
(74) *Attorney, Agent, or Firm* — Patterson & Sheridan, LLP

(57) ABSTRACT

Embodiments of the invention include methods for in-situ chamber dry cleaning a plasma processing chamber utilized for gate structure fabrication process in semiconductor devices. In one embodiment, a method for in-situ chamber dry clean includes supplying a first cleaning gas including at least a boron containing gas into a processing chamber in absence of a substrate disposed therein, supplying a second cleaning gas including at least a halogen containing gas into the processing chamber in absence of the substrate, and supplying a third cleaning gas including at least an oxygen containing gas into the processing chamber in absence of the substrate.

14 Claims, 3 Drawing Sheets

(56) References Cited

U.S. PATENT DOCUMENTS

| | | |
|---|---|---|
| 6,297,095 B1 | 10/2001 | Muralidhar et al. |
| 6,300,202 B1 | 10/2001 | Hobbs et al. |
| 6,319,730 B1 | 11/2001 | Ramdani et al. |
| 6,323,143 B1 | 11/2001 | Yu |
| 6,326,261 B1 | 12/2001 | Tsang et al. |
| 6,348,386 B1 | 2/2002 | Gilmer |
| 6,855,643 B2 | 2/2005 | Nallan et al. |
| 6,926,014 B2* | 8/2005 | Cheng et al. ............... 134/22.18 |
| 2003/0005943 A1* | 1/2003 | Singh et al. .................... 134/1.1 |
| 2005/0202167 A1* | 9/2005 | Wu ....................... C23C 14/083 427/226 |
| 2009/0139540 A1* | 6/2009 | Lau ................................ 134/1.1 |
| 2011/0162674 A1* | 7/2011 | Tang ................ H01J 37/32091 134/1.1 |

* cited by examiner

US 9,533,332 B2

METHODS FOR IN-SITU CHAMBER CLEAN UTILIZED IN AN ETCHING PROCESSING CHAMBER

CROSS-REFERENCE TO RELATED APPLICATIONS

This application claims benefit of U.S. Provisional Application Ser. No. 61/544,009 filed Oct. 6, 2011, which is incorporated by reference in its entirety.

BACKGROUND

Field

Embodiments of the present invention generally relate to methods and apparatus for in-situ cleaning a plasma processing chamber utilized to etch a substrate. Particularly, embodiments of the present invention relate to methods and apparatus for in-situ chamber dry cleaning a plasma processing chamber utilized to etch a metal gate structure formed in semiconductor devices on the substrate.

Description of the Related Art

Ultra-large-scale integrated (ULSI) circuits may include more than one million electronic devices (e.g., transistors) that are formed on a semiconductor substrate, such as a silicon (Si) substrate, and cooperate to perform various functions within the device. Typically, the transistors used in the ULSI circuits are complementary metal-oxide-semiconductor (CMOS) field effect transistors. A CMOS transistor has a gate structure comprising a polysilicon gate electrode and gate dielectric, and is disposed between a source region and drain regions that are formed in the substrate.

Plasma etching is commonly used in the fabrication of transistors and other electronic devices. During plasma etch processes used to form transistor structures, one or more layers of a film stack utilized to form a gate structure (e.g., layers of silicon, polysilicon, titanium nitride (TiN) or titanium oxide ($TiO_2$), hafnium dioxide ($HfO_2$), silicon dioxide ($SiO_2$), metal materials, and the like) are typically exposed to etchants comprising at least one halogen-containing gas, such as hydrogen bromide (HBr), chlorine ($Cl_2$), boron chlorine ($BCl_3$), carbon tetrafluoride ($CF_4$), ethylene ($C_2H_4$) and the like, supplied in a processing chamber. For example, as depicted in FIG. 1, a semiconductor device 100 is disposed on a substrate 102. A gate dielectric layer 104, such as $SiO_2$, is disposed on the substrate 102. Subsequently, a high-k material 106, such as a hafnium containing layer, is disposed on the gate dielectric layer 104 followed by a capping layer 108. Suitable examples of the capping layer 108 may be metal layers, such as aluminum metal or lanthanum (La) metal. A metal gate electrode layer 110, such as a TiN or TiO layer, and a poly silicon gate electrode layer 112 is then consecutively formed on the capping layer 108. After etching of the metal gate electrode layer 110, metal containing etching by-products, such as titanium containing residuals or hafnium containing residuals, may be formed during the etching process. The metal containing etching by-products may gradually build up on the surfaces of the substrate 102 as well as chamber components of the processing chamber. The metal containing etch by-products may also attack the surfaces of the chamber components, which in turn detrimentally affects the ability to maintain process control during circuit fabrication. Furthermore, metal containing etching by-products accumulating on components and surfaces of the processing chamber may impact recombination and surface reactions on the chamber walls, thereby affecting the overall substrate etching performance as well as becoming a source of unwanted particles that may contaminate the substrate 102. When the deposited metal containing etch by-products reach a certain thickness, the by-products may peel off from the inner wall of the plasma chamber and contaminate the substrate 102 by falling onto the substrate, causing irreparable defects to the device structure formed on the substrate. Accordingly, it is important to remove and clean such metal containing etching by-products periodically.

Therefore, there is a need for an improved process for cleaning plasma chamber after etching of a substrate.

SUMMARY

Embodiments of the invention include methods for in-situ chamber dry cleaning a plasma processing chamber utilized for gate structure fabrication process in semiconductor devices. In one embodiment, a method for in-situ chamber dry clean includes supplying a first cleaning gas including at least a boron containing gas into a processing chamber in absence of a substrate disposed therein, supplying a second cleaning gas including at least a halogen containing gas into the processing chamber in absence of the substrate, and supplying a third cleaning gas including at least an oxygen containing gas into the processing chamber in absence of the substrate.

In another embodiment, a method for cleaning a plasma processing chamber includes supplying a first cleaning gas including a mixture of at least a boron containing gas and a fluorine containing gas into a processing chamber in absence of a substrate disposed therein, supplying a second cleaning gas including at least a halogen containing gas into the processing chamber in absence of the substrate, and supplying a third cleaning gas including a mixture of at least an oxygen containing gas and a fluorine into the processing chamber in absence of the substrate.

In yet another embodiment, a method for in-situ chamber dry clean includes supplying a first gas including a mixture of at least a $BCl_3$ gas and a $CF_4$ gas into the processing chamber, supplying a second gas including at least a $Cl_2$ gas into the processing chamber, and supplying a third gas including a mixture of at least an $O_2$ gas and $CF_4$ gas into the processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention provide methods and apparatus for an in-situ chamber clean process utilized to clean a plasma processing chamber. The in-situ cleaning process is beneficial after etching. The in-situ cleaning process efficiently remove etch by-products from the plasma processing chamber without damaging chamber components. In one embodiment, the in-situ cleaning process may be performed in any suitable plasma processing chamber. In an exemplary embodiment, the in-situ cleaning process may be performed in a plasma etch chamber, for example, a Decoupled Plasma Source (DPS), DPS-II, or DPS Plus, DPS DT, or AdvantEdge etch reactor of a CENTURA® etch system, a HART etch reactor, and a HART TS etch reactor, all of which are available from Applied Materials, Inc., of Santa Clara, Calif. It is contemplated that suitably adapted plasma etch chambers, including those available from other manufacturers, may also be utilized.

Figure 2:
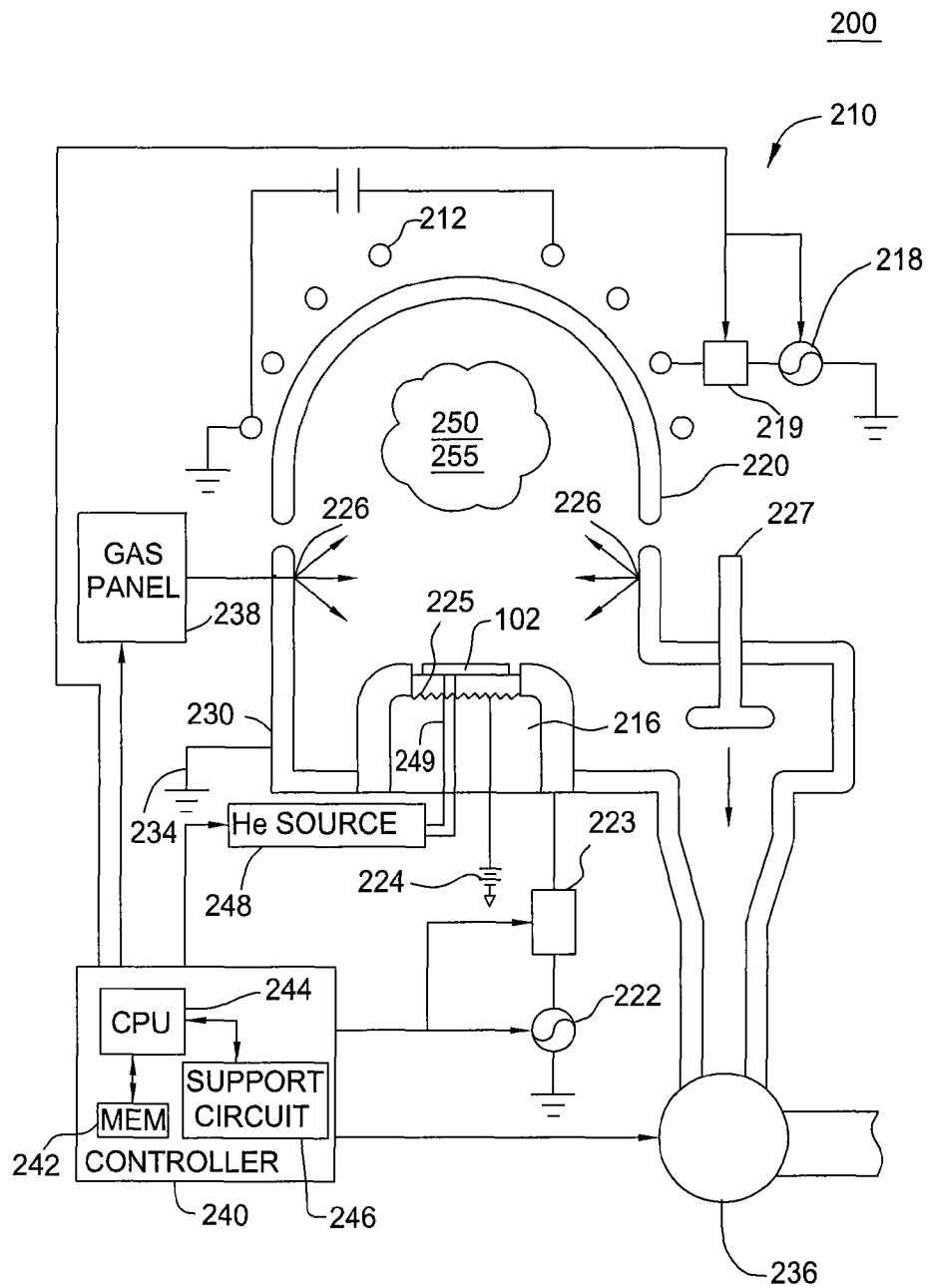
FIG. 2 depicts a schematic diagram of a plasma processing chamber for performing gate structure etching processes according to one embodiment of the invention.

FIG. 2 depicts a schematic diagram of one embodiment of an illustrative etch processing chamber 200 suitable for practicing the invention. The chamber 200 includes a conductive chamber wall 230 that supports a dielectric dome-shaped ceiling (referred hereinafter as the dome 220). The ceiling 200 may have a flat or dome shape. The wall 230 is connected to an electrical ground 234.

At least one inductive coil antenna segment 212 is coupled to a radio-frequency (RF) source 218 through a matching network 219. The antenna segment 212 is positioned exterior to a ceiling 220 and is utilized to maintain a plasma formed from process gases within the chamber. In one embodiment, the source RF power applied to the inductive coil antenna 212 is in a range between about 0 Watts to about 2500 Watts at a frequency between about 50 kHz and about 13.56 MHz. In another embodiment, the source RF power applied to the inductive coil antenna 212 is in a range between about 200 Watts to about 800 Watts, such as at about 400 Watts.

The processing chamber 200 also includes a substrate support pedestal 216 (biasing element) that is coupled to a second (biasing) RF source 222 that is generally capable of producing an RF signal to generate a bias power about 1500 Watts or less (e.g., no bias power) at a frequency of approximately 13.56 MHz. The biasing source 222 is coupled to the substrate support pedestal 216 through a matching network 223. The bias power applied to the substrate support pedestal 216 may be DC or RF.

In operation, a substrate 102 is placed on the substrate support pedestal 216 and is retained thereon by conventional techniques, such as electrostatic chucking, vacuum or mechanical clamping, during an etching process. Gaseous components are supplied from a gas panel 238 to the processing chamber 200 through entry ports 226 to form a gaseous mixture 250. A plasma, formed from the mixture 250, is maintained in the processing chamber 200 by applying RF power from the RF sources 218 and 222, respectively, to the antenna 212 and the substrate support pedestal 216. The pressure within the interior of the processing chamber 200 is controlled using a throttle valve 227 situated between the processing chamber 200 and a vacuum pump 236. The temperature at the surface of the chamber walls 230 is controlled using liquid-containing conduits (not shown) that are located in the walls 230 of the processing chamber 200.

The temperature of the substrate 102 is controlled by stabilizing the temperature of the support pedestal 216 and flowing a heat transfer gas from source 248 via conduit 249 to channels formed by the back of the substrate 102 and grooves (not shown) on the pedestal surface. Helium gas may be used as the heat transfer gas to facilitate heat transfer between the substrate support pedestal 216 and the substrate 102. During the etch process, the substrate 102 is heated by a resistive heater 225 disposed within the substrate support pedestal 216 to a steady state temperature via a DC power source 224. Helium disposed between the pedestal 216 and substrate 102 facilitates uniform heating of the substrate 102. Using thermal control of both the dome 220 and the substrate support pedestal 216, the substrate 102 may be maintained at a temperature of between about 100 degrees Celsius and about 500 degrees Celsius.

Those skilled in the art will understand that other forms of etch chambers may be used to practice the invention. For example, chambers with remote plasma sources, microwave plasma chambers, electron cyclotron resonance (ECR) plasma chambers, and the like may be utilized to practice the invention.

A controller 240, including a central processing unit (CPU) 244, a memory 242, and support circuits 246 for the CPU 244 is coupled to the various components of the etch processing chamber 200 to facilitate control of the etch process. To facilitate control of the chamber as described above, the CPU 244 may be one of any form of general purpose computer processor that can be used in an industrial setting for controlling various chambers and subprocessors. The memory 242 is coupled to the CPU 244. The memory 242, or computer-readable medium, may be one or more of readily available memory such as random access memory (RAM), read only memory (ROM), floppy disk, hard disk, or any other form of digital storage, local or remote. The support circuits 246 are coupled to the CPU 244 for supporting the processor in a conventional manner. These circuits include cache, power supplies, clock circuits, input/output circuitry and subsystems, and the like. Etching and cleaning methods, such as described herein, is generally stored in the memory 242 as a software routine. The software routine may also be stored and/or executed by a second CPU (not shown) that is remotely located from the hardware being controlled by the CPU 244.

Figure 3:
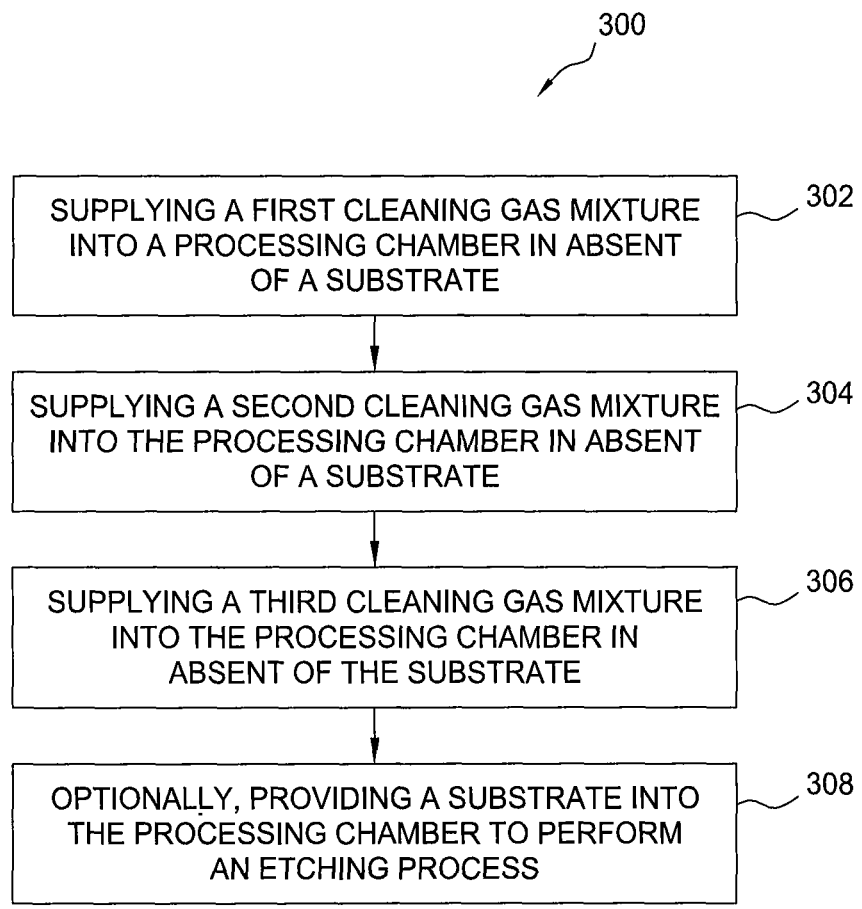
FIG. 3 depicts a flow chart of a method for cleaning a plasma processing chamber according to one embodiment of the invention.

FIG. 3 illustrates a method 300 for cleaning a plasma processing chamber, such as the processing chamber 200 depicted in FIG. 2, utilized to perform gate structure etching processes. The method 300 includes an in-situ chamber dry cleaning process according to embodiments of the present invention. The method 300 begins at block 302 by supplying a first cleaning gas into the processing chamber. As the interior of the plasma processing chamber, including chamber walls, substrate pedestal, liner, or other components disposed in the plasma processing chamber, may have film accumulation or contamination disposed thereon from previous etching processes, the first cleaning gas as supplied into processing chamber is configured to clean the interior of the plasma processing chamber. The first cleaning gas as supplied to perform the cleaning process removes contaminates or film accumulation from the interior of the plasma processing chamber, thereby preventing unwanted particulate from falling on the substrate disposed on the substrate pedestal during the subsequent etching processes.

In one embodiment, the first cleaning gas includes at least a boron containing gas. In another embodiment, the first cleaning gas includes a mixture of at least the boron containing gas and a fluorine containing gas. In yet another embodiment, the first cleaning gas includes a mixture of at least the boron containing gas, the fluorine containing gas, and a halogen containing gas. It is believed that the boron elements contained in the boron containing gas assist removing the metal contaminates, such as Ti, Ta, Al, or Hf containing materials, from the interior of the plasma processing chamber. However, excess boron elements remaining in the processing chamber may cause boron particles or boron residuals to adversely attack chamber components, such as the electrostatic chuck of the substrate support pedestal. Accordingly, the fluorine containing gas supplied in the first cleaning gas may efficiently remove excess boron elements to prevent the chamber components from attack. Furthermore, the halogen containing gas supplied in the first cleaning gas may assist removing metal contaminates, such as Ti, Ta, Al, or Hf containing materials, as well as other residuals from the processing chamber. As the contaminates and/or film accumulation remaining in the interior of the processing chamber may also includes sources from other materials, such as a photoresist layers (e.g., a carbon based material) or nitrogen or oxygen containing material, the halogen containing gas as supplied for cleaning may efficiently react and the remove the these residuals from the plasma processing chamber.

In one embodiment, the boron containing gas supplied in the first cleaning gas includes $BCl_3$, $BH_3$, $B_2H_6$, or other suitable boron containing gas and the like. The fluorine containing gas may generally have a formula of $C_xF_y$, or $C_xH_yF_z$, wherein the x, y, z are integers greater than or at least 1. In one embodiment, the fluorine containing gas as used in the first cleaning gas may be selected from a group consisting of $CF_4$, $CHF_3$, $CH_2F_2$, $C_2F_6$, $C_2F_8$, $SF_6$, $NF_3$ and the like. The halogen containing gas may be selected from a group consisting of $Cl_2$, HCl, $SiCl_4$, or other suitable chlorine containing gases and the like. In one example, the boron containing gas supplied in the first cleaning gas is $BCl_3$, the fluorine containing gas supplied in the first cleaning gas is $CF_4$ and the halogen containing gas supplied in the first cleaning gas is $Cl_2$.

During cleaning for supplying the first cleaning gas, several process parameters may be controlled. In one embodiment, the microwave power may be supplied to the plasma processing chamber between about 200 Watt and about 2000 Watt, such as about 1000 Watts. The pressure of the processing chamber may be controlled at between about 0.5 milliTorr and about 500 milliTorr, such as between about 5 milliTorr and about 50 milliTorr, for example about 10 milliTorr. The boron containing gas supplied in the first cleaning gas may be controlled at a flow rate between about 10 sccm and about 200 sccm, for example about 50 sccm. The fluorine containing gas supplied in the first cleaning gas may be controlled at a flow rate between about 10 sccm to about 500 sccm, for example about 100 sccm. The halogen containing gas supplied in the first cleaning gas may be controlled at a flow rate between about 10 sccm and about 300 sccm, for example about 200 sccm. In one embodiment, the boron containing gas and the fluorine containing gas supplied in the first cleaning gas is controlled at a ratio between about 1:0.1 to about 1:10, such as about 1:0.5 to about 1:5, such as about 1:2. The process may be performed between about 5 seconds and about 500 seconds.

The endpoint for supplying the first cleaning gas into the processing chamber may be by time mode or other suitable endpoint technique. In one embodiment, after the first cleaning gas is supplied to the processing chamber for between about 5 seconds and about 500 seconds, the supply of the first cleaning gas may be terminated.

At block 304, a second cleaning gas is supplied into the plasma processing chamber to continue cleaning the interior of the plasma processing chamber. The second gas may be provided after the flow of the first gas has terminated or the flows may be gradually transitioned. In one embodiment, the second cleaning gas includes a mixture of a halogen containing gas and an inert gas. As the boron containing gas supplied in the first cleaning gas may remove metal containing materials from the interior of the plasma processing chamber, the halogen containing gas supplied in the second cleaning gas may assist continuing removing the remaining residuals, including other types of residuals, from the interior of the etch processing chamber. In one embodiment, the halogen containing gas may be selected from a group consisting of $Cl_2$, HCl, $SiCl_4$, or other suitable chlorine containing gas and the like. The inert gas may be supplied in the second cleaning gas may include He, Ar, or other suitable gases. In one example, the halogen containing supplied in the second cleaning gas is $Cl_2$ and the inert gas is Ar.

During cleaning for supplying the second cleaning gas, several process parameters may be controlled. In one embodiment, the microwave power may be supplied to the plasma processing chamber between about 200 Watt and about 2000 Watt, such as about 1000 Watts. The pressure of the processing chamber may be controlled at between about 0.5 milliTorr and about 500 milliTorr, such as between about 5 milliTorr and about 50 milliTorr, for example about 10 milliTorr. The halogen containing gas supplied in the second cleaning gas may be controlled at a flow rate between about 5 sccm and about 500 sccm, for example about 200 sccm. The inert gas supplied in the second cleaning gas may be controlled at a flow rate between about 5 sccm to about 500 sccm, for example about 200 sccm. In one embodiment, the halogen containing gas and the inert gas supplied in the second cleaning gas is controlled at a ratio between about 1:0.1 to about 1:10, such as about 1:0.5 to about 1:5, such as about 1:1. The process may be performed between about 5 seconds and about 500 seconds.

The endpoint for supplying the second cleaning gas into the processing chamber may be by time mode or other suitable endpoint techniques. In one embodiment, after the second cleaning gas is supplied to the processing chamber for between about 5 seconds and about 500 seconds, the supply of the second cleaning gas may be terminated.

Subsequently, at block 306, a third cleaning gas is supplied into the etch processing chamber to continuing removing contaminates and film residuals from the interior of the etch processing chamber. The third gas may be provided after the flow of the second gas has terminated, or the flows may be gradually transitioned. In one embodiment, the third cleaning gas includes at least an oxygen containing gas. In another embodiment, the third cleaning gas includes a mixture of at least the oxygen containing gas, a fluorine containing gas and a halogen containing gas. The halogen containing gas and the fluorine containing gas supplied in the third cleaning gas may assist continuing removing the remaining residuals from the interior of the plasma processing chamber. The oxygen containing gas supplied in the third gas may assist removing carbon containing residuals, such as carbon polymers from photoresist layer or mask layer, from the processing chamber. In one embodiment, the fluorine containing gas as used in the third cleaning gas may generally have a formula of $C_xF_y$ or $C_xH_yF_z$, wherein x, y, z are integers greater than or at least 1. In one embodiment, the fluorine containing gas may be selected from a group consisting of $CF_4$, $CHF_3$, $CH_2F_2$, $C_2F_6$, $C_2F_8$, $SF_6$, and $NF_3$, and the like. The halogen containing gas may be selected from a group consisting of $Cl_2$, HCl, $SiCl_4$ or other suitable chlorine containing gases and the like. The oxygen containing gas may be supplied in the third cleaning gas may include $O_2$, $N_2O$, $NO_2$, CO, $CO_2$ or other suitable gases. In one example, the oxygen containing gas supplied in the third cleaning gas is $O_2$ the fluorine containing gas supplied in the third cleaning gas is $CF_4$, and the halogen containing gas supplied in the third cleaning gas is $Cl_2$.

During cleaning for supplying the third cleaning gas, several process parameters may be controlled. In one embodiment, the microwave power may be supplied to the plasma processing chamber between about 200 Watt and about 2000 Watt, such as about 1000 Watts. The pressure of the processing chamber may be controlled at between about 0.5 milliTorr and about 500 milliTorr, such as between about 5 milliTorr and about 50 milliTorr, for example about 30 milliTorr. The halogen containing gas supplied in the third cleaning gas may be controlled at a flow rate between about 5 sccm and about 500 sccm, for example about 50 sccm. The fluorine containing gas supplied in the third cleaning gas may be controlled at a flow rate between about 0.5 sccm to about 500 sccm, for example about 180 sccm. The oxygen containing gas supplied in the third cleaning gas may be controlled at a flow rate between about 0.5 sccm and about 500 sccm, for example about 60 sccm. In one embodiment, the halogen containing gas and the fluorine containing gas supplied in the third cleaning gas is controlled at a ratio between about 1:0.1 to about 1:10, such as about 1:0.5 to about 1:5, such as about 1:3.6. The process may be performed between about 5 seconds and about 500 seconds.

Figure 1:
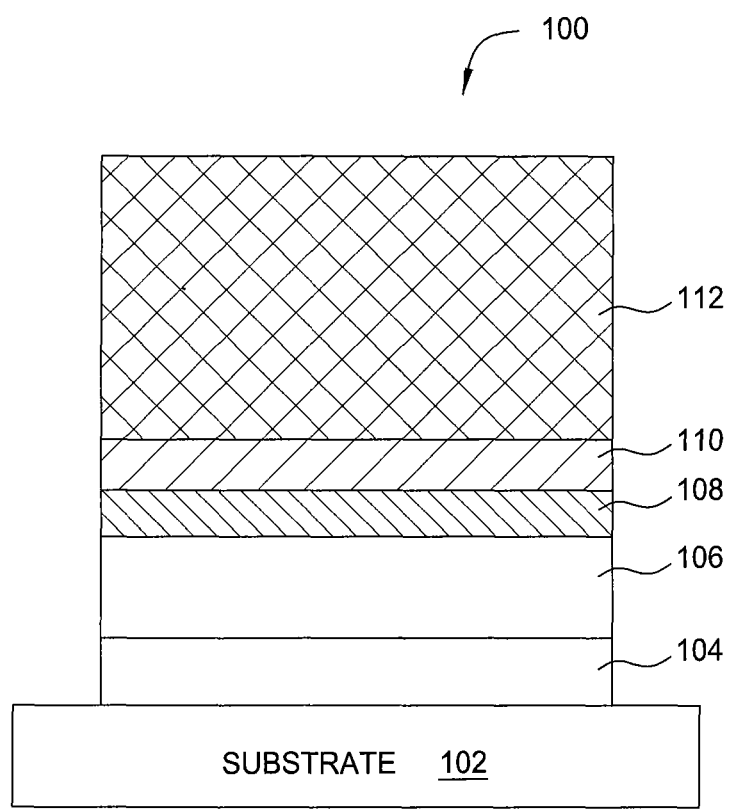
FIG. 1 depicts a sectional view of one embodiment of an gate structure disposed on a substrate.

At block 308, after the third cleaning gas supplied to the processing chamber is terminated and the cleaning process is completed, a substrate may be optionally transferred into the processing chamber for processing. In one embodiment, the processing chamber may be configured to etch a metal electrode layer, such as the etching the metal electrode layer 110, as depicted in FIG. 1. In another embodiment, the processing chamber may also be configured to etch any materials, including the capping layer 108, high-k material 106, the gate dielectric material 104 or the polysilicon layer 112 utilized to form a gate structure depicted in FIG. 1. In yet another embodiment, the processing chamber may be configured to etch any materials as needed. In an exemplary embodiment, the processing chamber is configured to etch a titanium containing material, such as a TiN, TiON, or $TiO_2$. During etching, an etching gas is supplied into the processing chamber. An etching gas may include least a halogen containing gas. Suitable examples of the halogen containing include, but not limited to, a chlorine containing gas ($Cl_2$), boron chloride ($BCl_3$), and hydrogen chloride (HCl), hydrogen bromide (HBr), nitrogen trifluoride ($NF_3$), sulfur hexafluoride gas ($SF_6$), tetrafluoromethane gas ($CF_4$) and the like. Optionally, a carrier gas and/or an inert gas may be supplied with the etching gas to the processing chamber. Examples of the carrier gas include oxygen gas, nitrogen gas, such as $N_2O$, $NO_2$, or inert gas, such as Ar or He, and the like.

Several process parameters are regulated while the gate etching gas is supplied into the processing chamber. In one embodiment, the chamber pressure is regulated between about 2 mTorr to about 100 mTorr. RF source power may be applied to maintain a plasma formed from the gate etching gas. For example, a power of about 100 Watts to about 1500 Watts may be applied to an inductively coupled antenna source to maintain a plasma inside the etch chamber. The gate etching gas may be flowed into the chamber at a rate between about 0.5 sccm to about 1000 sccm. For example, the halogen containing gas may be supplied at a flow rate between about 0 sccm and about 1000 sccm. The carrier gas may be supplied at a flow rate between about 0 sccm and about 1000 sccm and the inert gas may be supplied at a flow rate about 0 sccm and about 1000 sccm. A substrate temperature is maintained between about 10 degrees Celsius to about 500 degrees Celsius, such as about 50 degrees Celsius.

Accordingly, methods and apparatus for performing an in-situ cleaning process are provided to clean a plasma processing chamber without breaking vacuum. The methods includes a multiple cleaning steps to clean a plasma processing chamber prior to and after a plasma etching process. The multiple cleaning steps may efficiently remove the residuals, re-deposits and film layer with different types of materials, including metal contaminates and carbon containing contaminates, from the interior of the plasma processing chamber, thereby maintaining the plasma processing chamber in a desired clean condition and producing high quality gate structure formed for semiconductor devices.

While the foregoing is directed to embodiments of the present invention, other and further embodiments of the invention may be devised without departing from the basic scope thereof, and the scope thereof is determined by the claims that follow.

The invention claimed is:

1. A method for in-situ chamber dry cleaning a processing chamber, comprising:
   supplying a first cleaning gas including at least a $BH_3$ or $B_2H_6$ gas and a $CF_4$ gas into a processing chamber in absence of a substrate disposed therein to remove a Ta containing material or a Ti containing material present in the processing chamber, wherein a ratio of the $BH_3$ or $B_2H_6$ gas to the $CF_4$ gas is controlled at between about 1:0.5 and about 1:5;
   subsequently switching the first cleaning gas to a second cleaning gas including at least a halogen containing gas into the processing chamber in absence of the substrate to continue removing the Ta containing material or the Ti containing material remaining in the processing chamber; and
   subsequently switching the second cleaning gas to a third cleaning gas including at least an oxygen containing gas into the processing chamber in absence of the substrate to continue removing the Ta containing material or the Ti containing material remaining in the processing chamber.

2. The method of claim 1, wherein the first gas further comprises a halogen containing gas.

3. The method of claim 2, wherein the halogen containing gas supplied in the first gas is selected from a group consisting of $Cl_2$, HCl, and $SiCl_4$.

4. The method of claim 1, wherein the second cleaning gas further comprises an inert gas.

5. The method of claim 1, wherein the halogen containing gas supplied in the second gas is selected from a group consisting of $Cl_2$, HCl, and $SiCl_4$.

6. The method of claim 1, wherein the third cleaning gas further comprises fluorine containing gas.

7. The method of claim 6, wherein the third cleaning gas further comprises a halogen containing gas.

8. The method of claim 6, wherein the fluorine containing gas supplied in the third cleaning gas is selected from a group consisting of $CF_4$, $CHF_3$, $CH_2F_2$, $C_2F_6$, $C_2F_8$, $SF_6$ and $NF_3$.

9. The method of claim 7, wherein the halogen containing gas supplied in the third gas is selected from a group consisting of $Cl_2$, HCl, and $SiCl_4$.

10. The method of claim 1, wherein supplying the first cleaning gas further comprising:
applying an RF power to form a plasma in the first cleaning gas;
reacting with the Ta containing material or the Ti containing material disposed in an interior of the processing chamber.

11. The method of claim 1, further comprising:
terminating supplying of the third cleaning gas into the processing chamber; and
providing a substrate into the processing chamber;
performing an etching process on the substrate.

12. A method for in-situ chamber dry cleaning a processing chamber, comprising:
supplying a first cleaning gas including a mixture of a $BH_3$ or $B_2H_6$ gas and a $CF_4$ gas into a processing chamber in absence of a substrate disposed therein to remove a Ta containing material or a Ti containing material present in the processing chamber, wherein a ratio of the boron containing gas to the fluorine containing gas is controlled at between about 1:0.5 and about 1:5;
subsequently switching the first cleaning gas to a second cleaning gas including at least a halogen containing gas into the processing chamber in absence of the substrate to continue removing the Ta containing material or the Ti containing material remaining in the processing chamber; and
subsequently switching the second cleaning gas to a third cleaning gas including a mixture of at least an oxygen containing gas and a fluorine into the processing chamber in absence of the substrate to continue removing the Ta containing material or the Ti containing material remaining in the processing chamber.

13. The method of claim 12, wherein the boron containing gas supplied in the first cleaning gas reacts with the Ta containing material or the Ti containing material deposited on an interior of the processing chamber during an etch process.

14. A method for in-situ chamber dry cleaning a processing chamber, comprising:
supplying a first gas including a mixture of at least a $BH_3$ or $B_2H_6$ gas and a $CF_4$ gas into the processing chamber to remove a Ta containing material or a Ti containing material present in the processing chamber;
subsequently switching the first gas to a second gas including at least a $Cl_2$ gas into the processing chamber to continue removing the Ta containing material or the Ti containing material remaining in the processing chamber; and
subsequently switching the second gas to a third gas including a mixture of at least an $O_2$ gas and $CF_4$ gas into the processing chamber to continue removing the Ta containing material or the Ti containing material remaining in the processing chamber.

* * * * *